(12) United States Patent
Bulzacchelli et al.

(10) Patent No.: US 9,444,437 B2
(45) Date of Patent: Sep. 13, 2016

(54) CIRCUITS AND METHODS FOR DFE WITH REDUCED AREA AND POWER CONSUMPTION

(71) Applicant: INTERNATIONAL BUSINESS MACHINES CORPORATION, Armonk, NY (US)

(72) Inventors: John F. Bulzacchelli, Yonkers, NY (US); Byungsub Kim, Cambridge, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/670,540

(22) Filed: Mar. 27, 2015

(65) Prior Publication Data

US 2015/0200792 A1  Jul. 16, 2015

Related U.S. Application Data

(63) Continuation of application No. 13/931,123, filed on Jun. 28, 2013, now Pat. No. 9,008,169, which is a continuation of application No. 12/366,843, filed on Feb. 6, 2009, now Pat. No. 8,477,833.

(51) Int. Cl.
*H03K 3/356* (2006.01)
*H04L 25/03* (2006.01)
*H03K 3/012* (2006.01)

(52) U.S. Cl.
CPC ......... *H03K 3/35613* (2013.01); *H03K 3/012* (2013.01); *H04L 25/03006* (2013.01);
(Continued)

(58) Field of Classification Search
CPC .................. H04L 25/03038; H04L 25/03019; H04L 25/03057; H04L 2025/0349
USPC .......................................... 375/229, 232–233
See application file for complete search history.

(56) References Cited

U.S. PATENT DOCUMENTS 5,293,402 A    3/1994 Crespo et al.
6,421,381 B1   7/2002 Raghavan
(Continued)

FOREIGN PATENT DOCUMENTS

CN     1213919A A1    4/1999
CN     1684453 A      10/2005
(Continued)

OTHER PUBLICATIONS

Beukema, Troy., et al. A 6.4GB/S SERDES Core With Feed-Forward and Decision-Feedback Equalization. 2005 IEEE. IEEE Journal of Solid-State Circuits. vol. 40, No. 12. Dec. 2005. pp. 2633-2645.
(Continued)

*Primary Examiner* — Sam K Ahn
*Assistant Examiner* — Janice Tieu
(74) *Attorney, Agent, or Firm* — Tutunjian & Bitetto, P.C.; Vazken Alexanian

(57) ABSTRACT

A 1/n-rate decision feedback equalizer (DFE) and method include a plurality of branches. Each branch includes a separate summer circuit configured to add a respective feedback signal to a received input and a latch configured to receive an output of the summer circuit to provide different partial bit sequences based on a clock signal. A feedback circuit includes a multiplexer configured to multiplex the different partial bit sequences of each branch to assemble a full rate bit sequence and a filter configured to provide cancellation of intersymbol interference (ISI) from the received input.

16 Claims, 11 Drawing Sheets

(52) U.S. Cl.
CPC ... *H04L25/03057* (2013.01); *H04L 25/03146* (2013.01); *H04L 25/03267* (2013.01); *H03K 3/356139* (2013.01); *H04L 2025/0349* (2013.01)

(56) References Cited

U.S. PATENT DOCUMENTS

| | | | |
|---|---|---|---|
| 6,751,255 | B1* | 6/2004 | Reuven ............ H03H 21/0012 375/230 |
| 7,006,565 | B1 | 2/2006 | Endres et al. |
| 7,106,099 | B1 | 9/2006 | Nix |
| 7,177,352 | B1 | 2/2007 | Plasterer et al. |
| 2002/0168002 | A1 | 11/2002 | Birru |
| 2004/0027185 | A1 | 2/2004 | Fiedler |
| 2006/0188043 | A1 | 8/2006 | Zerbe et al. |
| 2006/0239341 | A1 | 10/2006 | Marlett et al. |
| 2007/0147559 | A1* | 6/2007 | Lapointe ............ H03H 17/0223 375/350 |
| 2008/0187036 | A1* | 8/2008 | Park .................. H04L 25/03146 375/233 |
| 2008/0232454 | A1 | 9/2008 | Endres et al. |
| 2008/0310485 | A1 | 12/2008 | Soliman et al. |
| 2008/0310495 | A1* | 12/2008 | Bulzacchelli ..... H04L 25/03057 375/233 |
| 2009/0010320 | A1 | 1/2009 | Hollis |

FOREIGN PATENT DOCUMENTS

| | | |
|---|---|---|
| CN | 1716931 A | 1/2006 |
| CN | 1764175 A | 4/2006 |
| JP | 03030528 A | 2/1991 |
| JP | 2003518879 A | 6/2003 |
| JP | 2005523633 A | 8/2005 |
| JP | 2009225018 A | 10/2009 |

OTHER PUBLICATIONS

Bulzacchelli, John F., et al, A 10-GB/S 5-Tap DFE/4-Tap FFE Transceiver in 90-NM CMOS Technology. 2006 IEEE. IEEE Journal of Solid-State Circuits. vol. 41, No. 12. Dec. 2006. pp. 2885-2900.

Chi, Hyung-Joon, et al. A 3.2GB/S 8B Single-Ended Integrating DFE RX for 2-Drop DRAM Interface With Internal Reference Voltage and Digital Calibration. 2008 IEEE International Solid-State Circuits Conference, ISSCC 2008/ Session 5/ High-Speed Transceivers / 5.8. Digest of Technical Papers. Oct. 2008. pp. 112-133, 600.

Chung, Wonzoo, et al. Soft Decision Approaches for Blind Adaptive Decision Feedback Equalizers. 2003 4th IEEE Workshop on Signal Processing. Advances in Wireless Communications. Jun. 2003. pp. 447-451.

Crespo, Pedro M., et al. Pole-Zero Decision Feedback Equalization With a Rapidly Converging Adaptive IIR Algorithm. 1991 IEEE. IEEE Journal on Selected Areas in Communications. vol. 9, No. 6. Aug. 1991. pp. 817-829.

Dickson, Timothy O., et al. A 12-GB/S 11-MW Half-Rate Sampled 5-Tap Decision Feedback Equalizer With Current-Integrating Summers in 45-NM SOI CMOS Technology, 2008 IEEE, Digest Symposium. VLSI Circuits, Jun. 2008, pp. 58-59.

Fayomi, Christian Jesus B., et al. Low Power/Low Voltage High Speed CMOS Differential Track and Latch Comparator With Rail-to-Rail Input, Circuits and Systems. ISCAS 2000—IEEE International Symposium on Circuits and Systems. May 2000. vol. 5. pp. 653-656.

Heydari, Payam, et al. Design of Ultrahigh-Speed Low-Voltage CMOS CML Buffers and Latches. 2004 IEEE. IEEE Transactions on Very Large Scale Integration (VLSI) Systems. vol. 12, No. 10. Oct. 2004, pp. 1081-1093.

Knickerbocker, John U., et al. 3-D Silicon Integration and Silicon Packaging Technology Using Silicon Through-Vias, 2006 IEEE, IEEE Journal of Solid-State Circuits. vol. 41, No. B. Aug. 2006. pp. 1718-1725.

Leibowitz, Brian S., at al. A 7.5GB/S 10-Tap DFE Receiver With First Tap Partial Response, Spectrally Gated Adaptation, and 2nd-Order Data-Filtered CDR. 2007 IEEE international Solid-State Circuits Conference. ISSCC 2007 / Session 12 / Gigabit CDRs and Equalizers / 12.4. Digest of Technical Papers. pp. 228-229, 599.

Magarini, M., et al. The Role of Virtual Noise in Uncontrained Frequency Domain Equalization. 2004 IEEE. Personal, Indoor and Mobile Radio Communications, 2004, PIMRC 2004. 15th IEEE International Symposium. vol. 1. Sep. 2004. pp. 469-473.

Mensink, Eisse, et al. A 0.2BPJ/B 2GB/S/CH Transceiver in 90NM CMOS for 10MM On-Chip Interconnects. 2007 IEEE International Solid-State Circuits Conference. ISSCC 2007 / Session 22 / Digital Circuit InnovatIons / 22.9. Digest of Technical Papers. Feb. 2007. pp. 414-415, 612.

Nedovic, Nikola, at al. A 40-TO-44GB/S 3X Oversampling CMOS CDR/1:16 Demux, 2007 IEEE. 2007 IEEE International Solid-State Circuits Conference. ISSCC 2007 / Session 12 / Gigabit CDRs and Equalizers / 12.2. pp. 224-225, 598.

Okaniwa, Yusuke, et al A 0.11UM CMOS Clocked Comparator for High-Speed Serial Communications, 2004 IEEE. 2004 Symposium on VLSI Circuits Digest of Technical Papers. pp. 198-201.

Park, Joshua C., et al. High-Speed CMOS Continuous-Time Complex Graphic Equalizer for Magnetic Recording. 1998 IEEE, IEEE Journal of Solid-State Circuits, vol. 33, No. 3, Mar. 1998. pp. 427-438.

Park, Matt, et al. A 7GB/S 9.3MW 2-Tap Current-Integrating DFE Receiver. 2007 IEEE international Solid-State Circuits Conference. ISSCC 2007 / Session 12 / Gigabit CDRs and Equalizers / 12.5. Digest of Technical Papers. Feb. 2007. pp. 230-231, 599.

Pekau, Holly, et al. A Re-Configurable High-Speed CMOS Track and Latch Comparator With Rail-to-Rail Input for IF Digitization. Circuits and Systems. 2005 IEEE International Symposium. May 2005, vol. 6. pp. 5369-5372.

Samid, Lourans, et al. A Dynamic Analysis of a Latched CMOS Comparator. Circuits and Systems. 2004 IEEE. ISCAS 2004. Proceedings of the 2004 International Symposium, May 2004. vol. 1. pp. 181-184,.

Shi, Wei, at al. When the Best Decision-Feedback Equalizer Is a Linear Equalizer. 36th Annual Allerton Conference on Communication, Control, and Computing. 1998. Los Angeles, CA, pp. 1-2.

Zukunft, Roland, et al. A Blind Adaptation Algorithm for Decision Feedback Equalization for Dual-Mode CAP-QAM Reception, 2002 IEEE, Global Telecommunications Conference. vol. 1. Nov. 2002. pp. 307-311.

Kennedy, J., et al. "A Parallel Architecture for Multilevel Decision Feedback Equalization" IEEE Transactions on Magnetics, vol. 34, No. 2. Mar. 1998. pp. 588-595.

International Search Report and Written Opinion for International Application No. PCT/EP2010/050286. Date of Mail: Feb. 17, 2011. (15 Pages).

Final Office Action issued on Aug. 2, 2013 for U.S. Appl. No. 13/590,913, filed Aug. 21, 2012.

"IIR Type of Pulse Shaping Filter and Blind Channel Identification" Dec. 2008. (52 Pages).

\* cited by examiner

CIRCUITS AND METHODS FOR DFE WITH REDUCED AREA AND POWER CONSUMPTION

CROSS-REFERENCE TO RELATED APPLICATIONS

This application is a Continuation application of co-pending U.S. patent application Ser. No. 13/931,123, filed on Jun. 28, 2013, which itself is a Continuation of issued U.S. Pat. No. 8,477,833, filed on Feb. 6, 2009 and issued on Jul. 2, 2013, both of which are incorporated herein by reference in their entirety.

BACKGROUND

1. Technical Field

The present invention relates generally to equalization techniques for high-speed data and more specifically to implementations of decision feedback equalizer circuits and methods for high-speed data communications with improved power efficiency.

2. Description of the Related Art

As the processing power of digital computing engines grows with improvements in technology, and increasingly interconnected networks are developed to harness this power, higher bandwidth data transmission is needed in systems such as servers and data communication routers. Increasing serial link data rates above a few gigabits per second becomes challenging, due to limited channel bandwidth. The bandwidth of an electrical channel (e.g., transmission line) may be reduced by several physical effects, including skin effect, dielectric loss, and reflections due to impedance discontinuities. In the time domain, limited channel bandwidth leads to broadening of the transmitted pulses over more than one unit interval (UI), and the received signal suffers from intersymbol interference (ISI).

An effective method of compensating for the signal distortions due to limited channel bandwidth is to add equalization functions to the input/output (I/O) circuitry. The use of a nonlinear equalizer known as a decision-feedback equalizer (DFE) in the receiver is particularly well-suited to equalizing a high-loss channel. Unlike linear equalizers, the DFE is able to flatten the channel response (and reduce signal distortion) without amplifying noise or crosstalk, which is a critical advantage when channel losses exceed 20-30 dB.

Referring to FIG. 1, a conventional multi-tap DFE 10 is illustrated. A binary output of a decision-making slicer (or latch) 12 is captured in a shift register delay line formed from a sequence of latches 14. Previously decided bits stored in the shift register (14) are fed back with weighted tap coefficients (H1, H2, . . . , HN) and added to the received input signal by means of a summing amplifier (or summer) 16. If the magnitudes and polarities of the tap weights (H1, H2, etc.) are properly adjusted to match the channel characteristics, the ISI from the previous bits in the data stream (termed "post-cursor ISI") will be cancelled, and the bits can be detected by the slicer 12 with a low bit error rate (BER). The adjustment of the tap weights can be performed either manually or automatically by an appropriate adaptive algorithm.

In general, the larger the number of taps that can be applied toward canceling ISI, the more effective the equalization becomes. Practical DFE implementations often employ as many as 10 feedback taps in order to accomplish equalization of difficult electrical channels at multi-gigabit-per-second data rates. Unfortunately, the large number of latches and feedback circuits used in a multi-tap DFE consumes significant power and chip area. In some applications, such as a high-end processor chip having thousands of I/Os, the power and area costs of a conventional multi-tap DFE are prohibitive, as the I/O circuitry would consume most of the system power and area budgets.

The area and power requirements of I/O circuitry will become even more stringent with the introduction of dense, fine-pitch silicon packaging technologies, which are expected to be capable of supporting tens of thousands of high data rate I/Os for local chip-to-chip interconnect. One example of such a dense packaging technology is a silicon carrier, the basic concept of which is sketched in FIG. 2.

Referring to FIG. 2, two chips 20 and 22 are mounted to silicon carrier 24 and connected together with surface wiring 26. The pitch of this surface wiring 26, which is fabricated with standard CMOS back-end-of-line (BEOL) processing, is only a couple of microns and permits a dense array of silicon carrier links to be formed between the chips 20 and 22. Silicon through vias 28 are used to connect power and signals vertically between the chips 20 and 22 and conventional first-level packaging. Due to their fine dimensions, the surface wires 26 used to form the silicon carrier links exhibit significant resistance per unit length.

SUMMARY

A 1/n-rate decision feedback equalizer (DFE) and method include a plurality of branches. Each branch includes a separate summer circuit configured to add a respective feedback signal to a received input and a latch configured to receive an output of the summer circuit to provide different partial bit sequences based on a clock signal. A feedback circuit includes a multiplexer configured to multiplex the different partial bit sequences of each branch to assemble a full rate bit sequence and a filter configured to provide cancellation of intersymbol interference (ISI) from the received input.

A method for decision feedback equalization includes summing a feedback signal from one or more branches of a 1/n rate decision feedback equalization circuit with a received input using a separate summer circuit for each branch, where n is any positive integer. An output of the summer circuit is received with a latch to provide different partial bit sequences based on a clock signal. An output of the latch is fed back to a multiplexer, the multiplexer being configured to multiplex the different partial bit sequences of each branch to assemble a full rate bit sequence. Intersymbol interference (ISI) is canceled from the received input.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 3A shows S21 response versus frequency and FIG. 3B shows impulse response versus time;

DETAILED DESCRIPTION OF PREFERRED EMBODIMENTS

Figure 1:
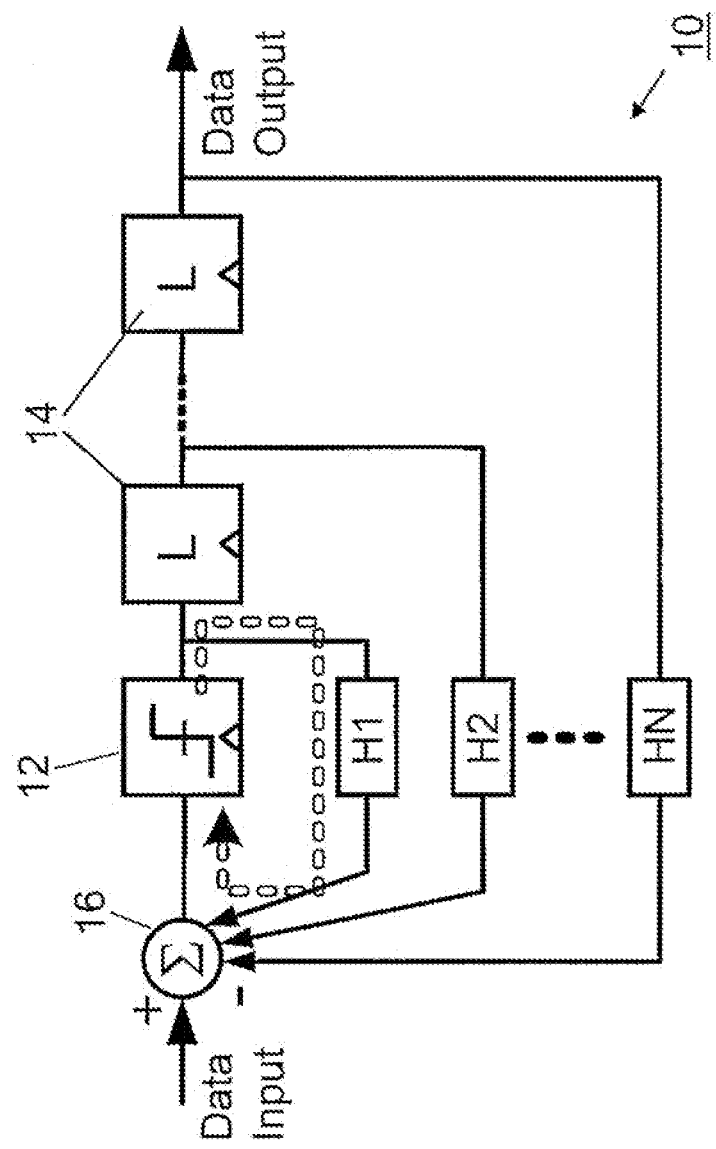
FIG. 1 is a block diagram showing a conventional multi-tap DFE, with tap weights adjusted to match post-cursors of channel response.

The present principles provide decision feedback equalizer (DFE) circuits and methods which employ a filter to replace one or more feedback loops that are employed in removing ISI from channels. In one embodiment, a 1/n-rate DFE (e.g., a half rate, quarter rate, etc.) includes an infinite impulse response (IIR) filter that filters the feedback signal to a summing amplifier. In addition, a combined summing/slicer circuit is provided, which further assists in reducing area and energy consumption. A double regenerating latch is also provided.

Embodiments of the present invention can take the form of an entirely hardware embodiment, an entirely software embodiment or an embodiment including both hardware and software elements. In a preferred embodiment, the present invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device). Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Circuits as described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
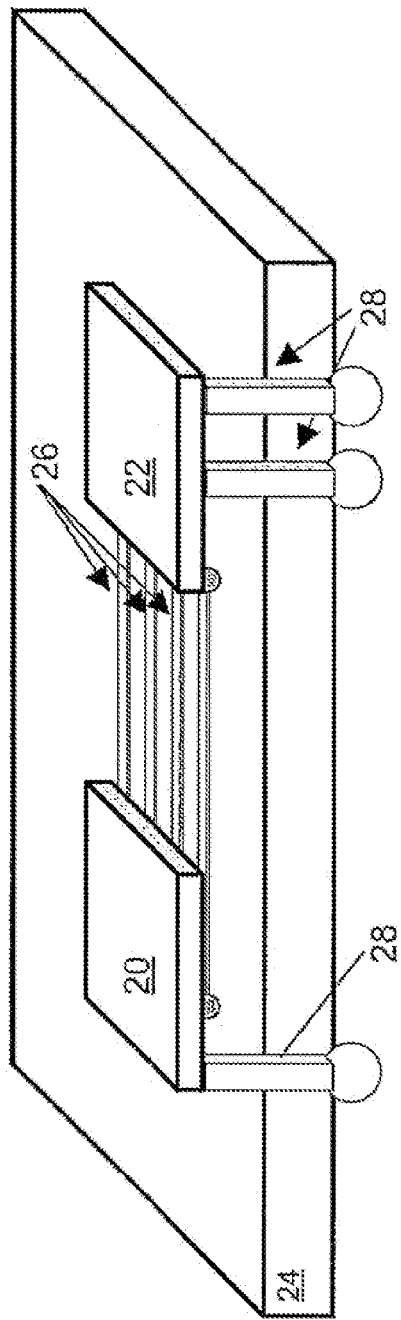
FIG. 2 is a perspective view of a silicon carrier with two chips connected by carrier links.
Figure 3B:
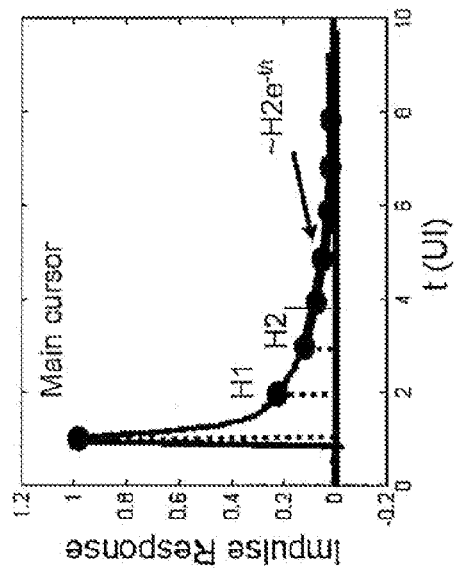
FIGS. 3A and 3B show characteristics of a 20 mm long silicon carrier channel where
Figure 3A:
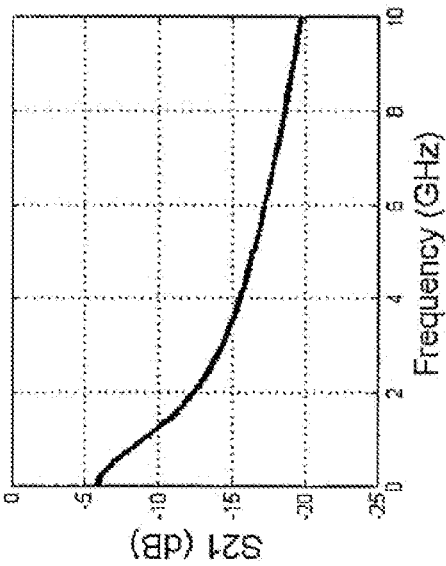

Referring now to the drawings in which like numerals represent the same or similar elements and initially to FIGS. 3A and 3B, a channel response of a 20 mm long link in both the frequency domain (i.e., S21 parameters) and the time domain, respectively is shown for carrier links 26 of FIG. 2. Due to series resistance, there is significant (~6 dB) DC attenuation, and the loss at 5 GHz is 17 dB. In the time domain, the response to a solitary "1" bit at 10 gigabits per second shows post-cursor ISI which extends over several bit periods. To compensate such a channel, a DFE would need many taps, but the attendant costs in power and area would be impractical in such a high-density I/O environment.

Careful study of the time domain channel response suggests a novel solution to equalizing such a high-resistance channel. The impulse response of the channel is well modeled by a decaying exponential at all times more than 2 unit intervals (UI) after a main cursor. Since the impulse response of a first-order RC low-pass filter has the shape of a decaying exponential, a filter may be employed in a DFE feedback path to generate the signal needed to cancel the post-cursor ISI in the received data input. For example, a DFE with a first-order RC low-pass feedback filter extends the data rate of 10 mm on-chip interconnects up to 2 gigabits per second. Since the large multiple of taps needed in a conventional DFE implementation is replaced by a simple RC filter, large power and area savings are attained.

Figure 4:
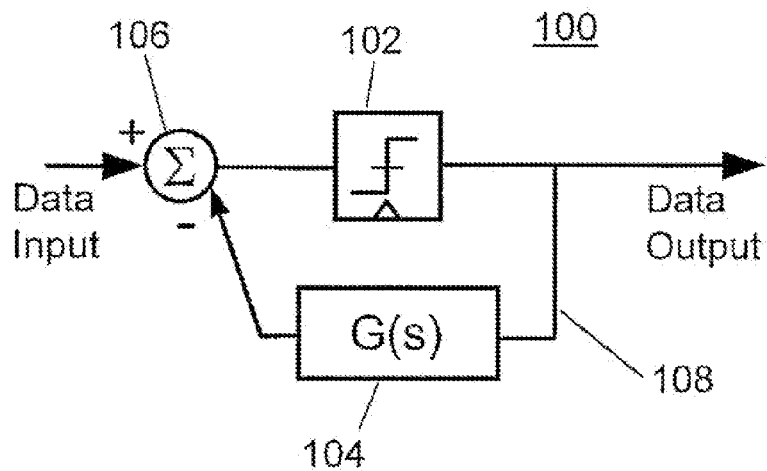
FIG. 4 is a block diagram showing a DFE with an analog continuous-time IIR filter in a feedback path.

Referring to FIG. 4, a continuous-time infinite impulse response (IIR) filter 104 with a frequency-domain transfer function G(s) is provided in a DFE feedback path 108 of a DFE circuit 100. A summing amplifier 106 sums the feedback from path 108 with the data input. When the channel response cannot be closely approximated with a first-order RC low-pass filter, a higher-order filter may provide better cancellation of ISI.

Figure 5:
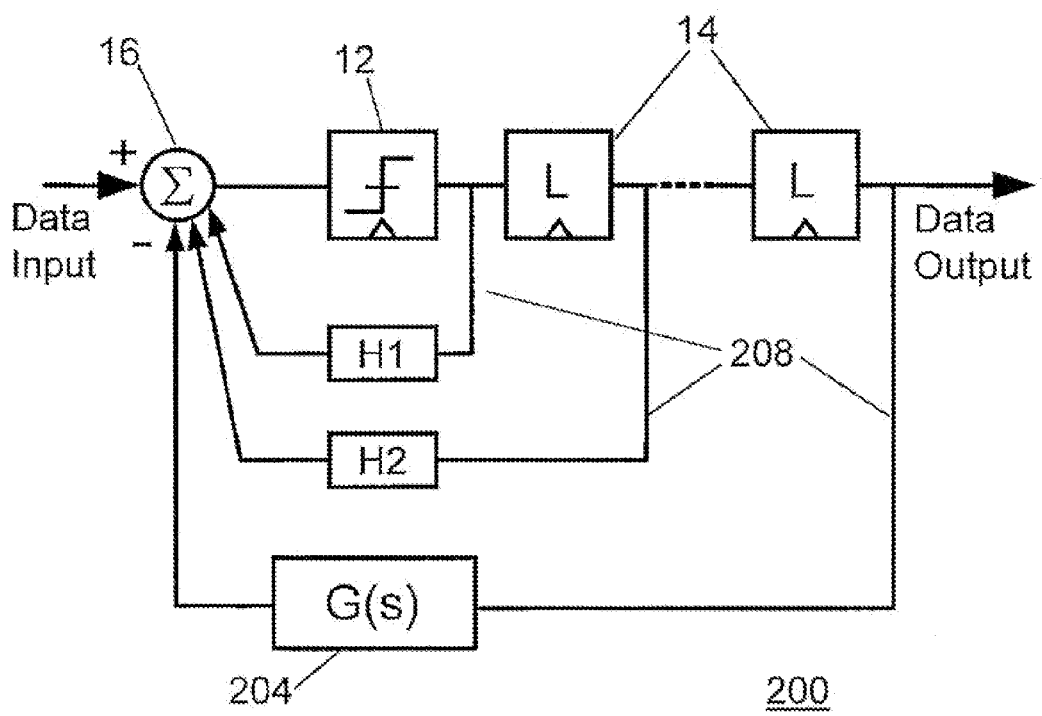
FIG. 5 is a block diagram showing a DFE with both conventional discrete taps and an IIR filter in the feedback path.

Referring to FIG. 5, for many channels, even better cancellation of ISI can be achieved if both conventional discrete taps (e.g., H1, H2) and an IIR filter 204 are placed in feedback paths 208 of the DFE 200. The first couple of discrete taps (e.g., H1 and H2) can be adjusted (independently of the IIR filter 204) to compensate for the post-cursors in the rapidly changing region of the channel impulse response immediately following the main cursor, as these early post-cursors often do not fall along the exponentially decaying curve followed by the later post-cursors. In fact, the impulse response of the 20 mm silicon carrier channel shown in FIG. 3B exemplifies this point, as the first post-cursor (labeled H1) does not accurately fall along the curve labeled $H2e^{-t/\tau}$ where $\tau$ is the time constant of the decaying exponential. Therefore, accurate equalization of such a silicon carrier link may employ DFE 200 with a discrete first tap (H1) which can be adjusted independently of the IIR filter 204 responsible for compensating the rest of the post-cursors in the channel response.

While DFE 200 with IIR filter 204 is an area- and power-efficient structure for equalizing many channels, including the example silicon carrier link of FIG. 2, full-rate DFE architectures may not be well suited for extending this concept to higher data rates. At data rates which approach the technology limit (such as 10 gigabits per second in present-day CMOS technology), half-rate DFE architectures are found to be more power-efficient than full-rate structures. Since there is no full-rate regenerated signal available for driving the input of an IIR filter, implementing a half-rate DFE with an IIR filter is very challenging.

Figure 6:
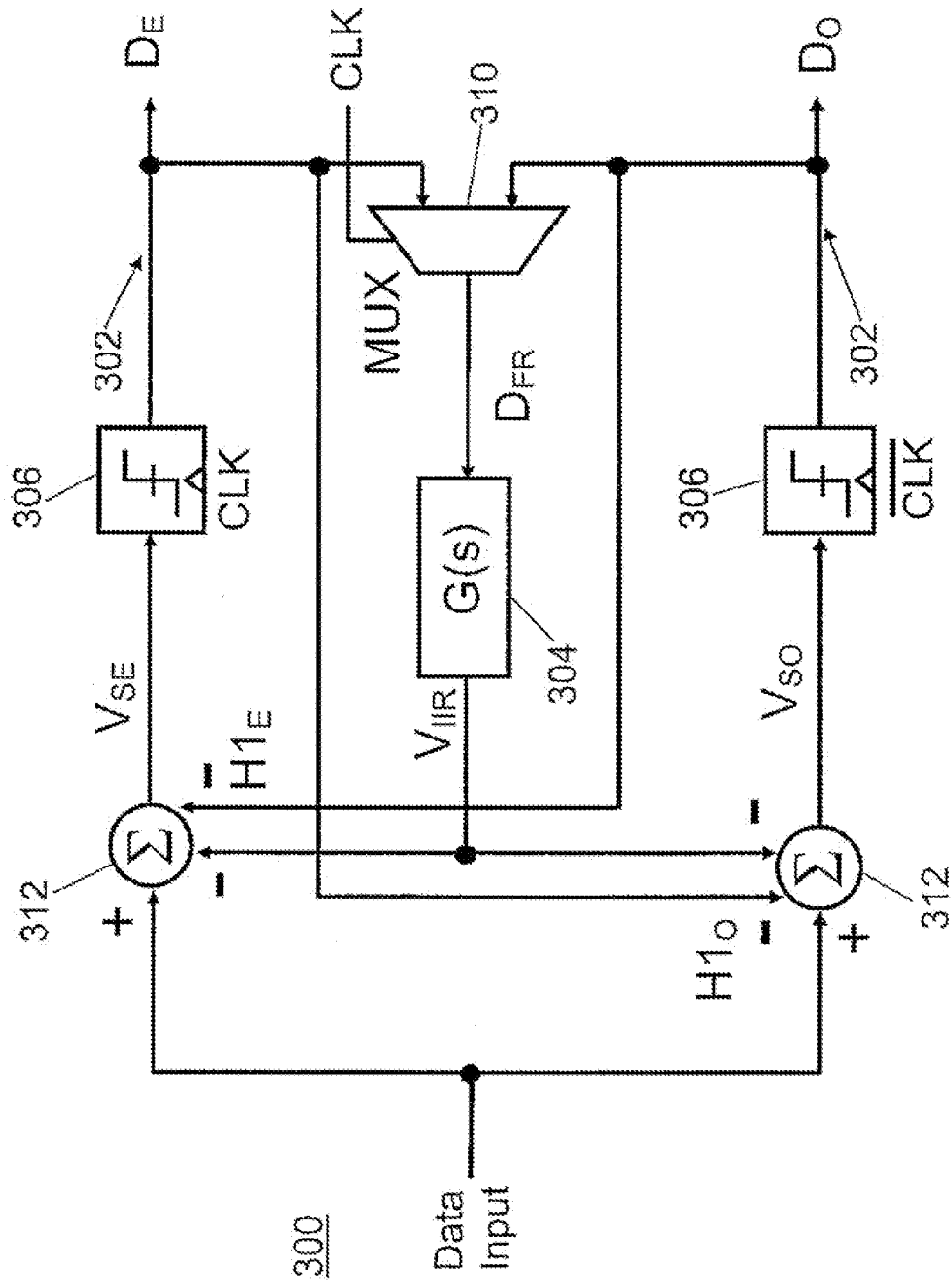
FIG. 6 is a block diagram showing a half-rate architecture of a DFE with IIR filter representing one illustrative embodiment.

Referring to FIG. 6, a half-rate DFE 300 is shown in accordance with an illustrative embodiment. A half-rate DFE 300 naturally demultiplexes input data into two parallel data streams 302 (specifically, even data bits, $D_E$, and odd data bits, $D_O$). Feeding one of the half-rate data streams into the IIR filter 304 does not give the desired response, as correct cancellation of the ISI demands that the impulse response of the IIR filter 304 be convolved with a complete bit sequence, not just the even data bits or the odd data bits. As mentioned, obtaining a signal suitable for driving the input of the IIR filter 304 is a challenge in making a half-rate implementation practical. The half-rate architecture 300 provides power- and area-efficient means for obtaining such a signal.

A pair of decision-making slicers (or latches) 306 driven by a half-rate clock CLK are used to sample the data input. The slicers 306 are driven on opposite phases of CLK (e.g., CLK and $\overline{CLK}$), so the top slicer 306 produces even data bits $D_E$ while the bottom slicer 306 produces odd data bits $D_O$. Summers 312 in front of the slicers 306 are used to add the DFE feedback signals to the received data input. A first DFE feedback tap (H1) is a conventional discrete type and can be independently adjusted to match the first post-cursor of the channel impulse response. In a half-rate architecture, the previous data bit is decided by the opposite DFE half, so the H1 tap for the even data path (denoted $H1_E$) is fed back from the odd data bits, and vice versa. The ISI due to the rest of the post-cursors in the channel impulse response is compensated by $V_{IIR}$, an output of the IIR filter 304.

Correct cancellation of the ISI needs that the impulse response of the IIR filter 304 be convolved with the complete bit sequence of the data input. To accomplish this, a 2:1 multiplexer (MUX) 310 with a selector driven by CLK is employed to interleave the even and odd data bits ($D_E$ and $D_O$) to form full-rate data ($D_{FR}$) suitable for driving the input of the IIR filter 304.

Figure 7:
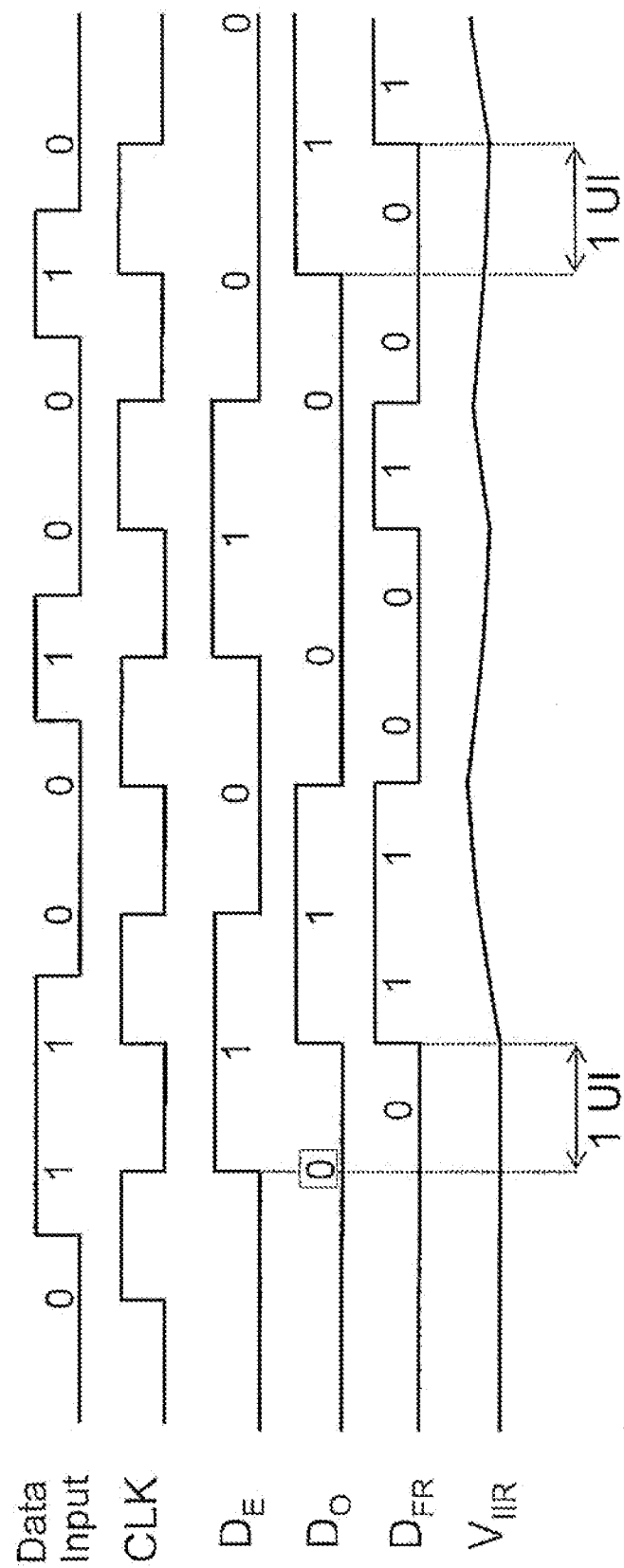
FIG. 7 is a timing diagram for the half-rate DFE architecture shown in FIG. 6.

In a timing diagram of FIG. 7, the phase of CLK is adjusted by a clock-and-data recovery (CDR) circuit or some other mechanism so that the input data bits are sampled at the center of the eye. The phase of the CLK signal driving the select of the MUX is chosen so that $D_{FR}$ is delayed by one UI relative to the first arrivals of the $D_E$ and $D_O$ bits, as indicated in FIG. 7. Because of this one UI delay, the earliest post-cursor compensated by the IIR filter output ($V_{IIR}$) is the second one (corresponding to an H2 tap in a conventional multi-tap DFE).

The embodiment of FIG. 6 represents an area- and power-efficient way of adding the IIR filter 304 to the half-rate DFE structure, as the only circuit overhead (besides the IIR filter 304 itself, of course) is the 2:1 MUX 310 used to form full-rate data. Even this small overhead can be reduced to negligible levels if the 2:1 MUX 310 and IIR filter 304 functions are combined in a single circuit.

Figure 8:
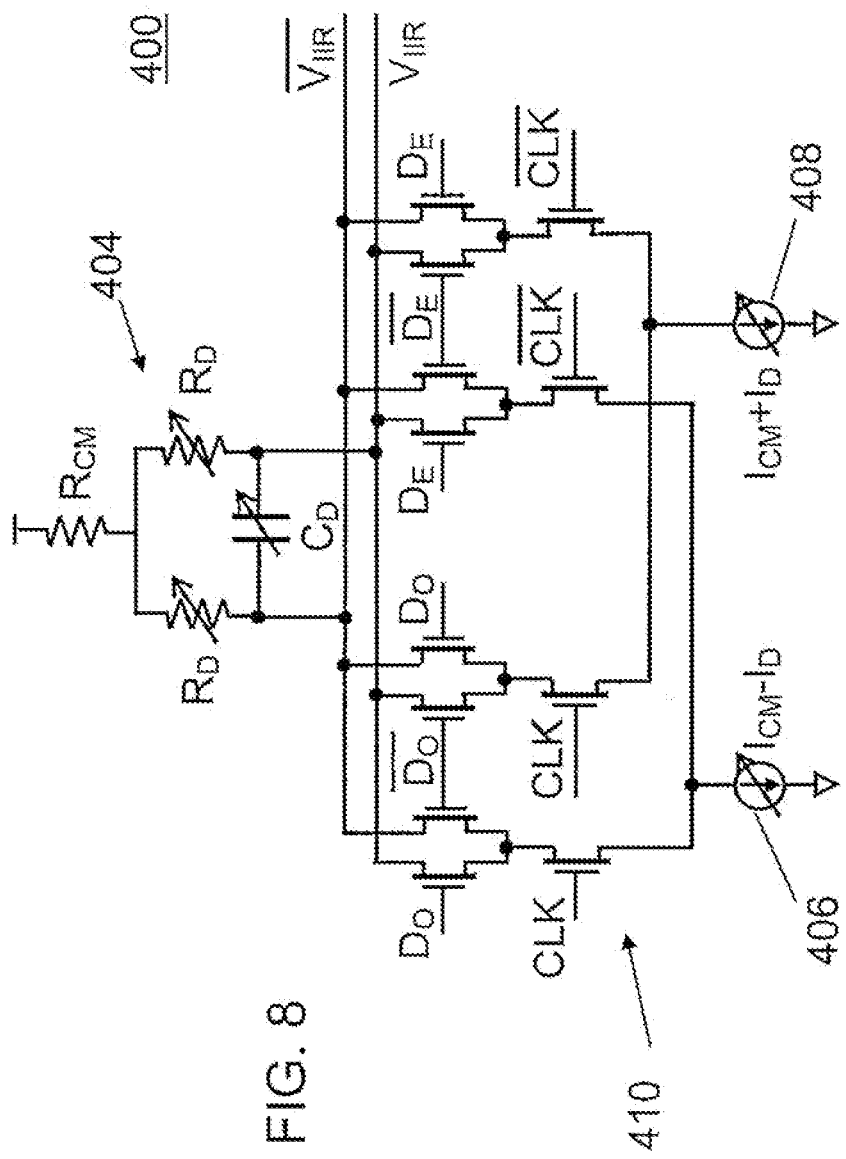
FIG. 8 is a schematic diagram showing an example circuit implementation in which a 2:1 MUX and an IIR filter are combined in a single stage.

Referring to FIG. 8, a schematic diagram shows an example circuit implementation in which a 2:1 MUX 410 and an IIR filter 404 are combined in a single current mode logic (CML) stage 400. The circuit 400 is fully differential, so that its differential output amplitude is proportional to $I_D$, the difference in two tail current sources 406 and 408. A common-mode current ($I_{CM}$) and a resistor $R_{CM}$ are set so that the desired common-mode output level from an IIR filter 404 is obtained. While $I_D$ can be used to scale the magnitude of the differential output signal, the RC time constant of the IIR filter 404 can be adjusted by tuning resistance $R_D$ and capacitance $C_D$ (for example, with switched resistors and switched capacitors). It should be noted that in this merged MUX/IIR filter circuit 400, the only signal that represents the full-rate data is a net current delivered into the RC load.

Figure 9:
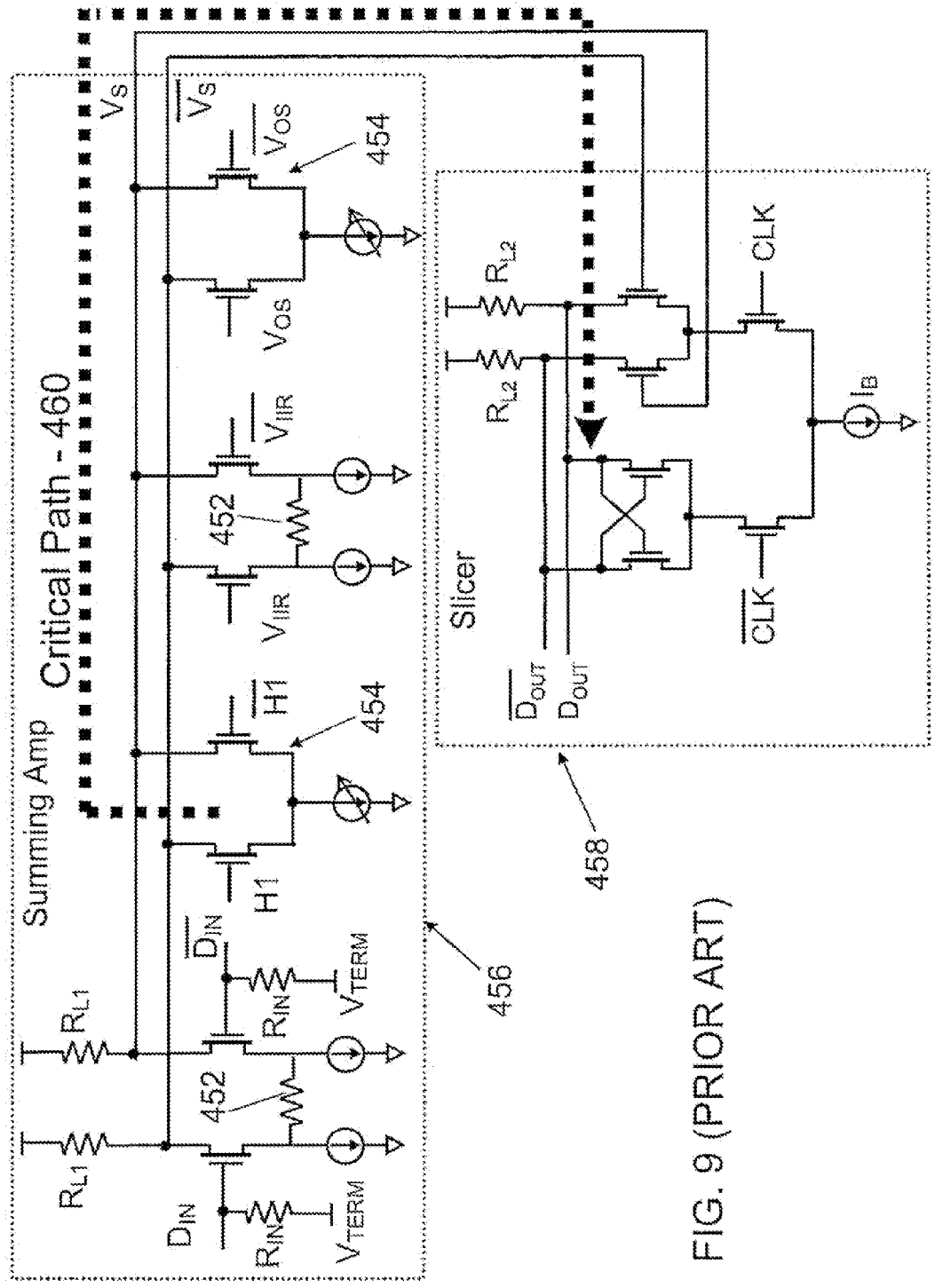
FIG. 9 is a schematic diagram showing an example CML circuit implementation of a DFE summing amplifier and slicer in accordance with the prior art.

The summing amplifiers 312 and decision-making slicers 306 in the architecture of FIG. 6 can be implemented with conventional circuit techniques. As an example, FIG. 9 illustrates how these elements can be implemented as CML circuits. With reference to FIG. 9, signal summation is accomplished in the current domain by connecting together ("dotting") drains (or collectors if implemented in bipolar technology) of multiple differential pairs of transistors. The differential pairs which receive the data input ($D_{IN}$) and the output of the IIR filter ($V_{IIR}$) are resistively degenerated with resistors 452 for more linear conversion of voltage to current. Resistive degeneration is not employed in the other differential pairs, which are used as current switches 454. The data inputs ($D_{IN}$ and $D_{IN}$ bar) have resistors $R_{IN}$ connected to a voltage $V_{TERM}$ for impedance termination. The tail current of the differential pair switched by DFE feedback signal H1 is adjusted to set the tap weight needed to compensate the first post-cursor of ISI. The differential pair switched by $V_{OS}$ provides DC current for compensating static offsets due to device mismatches. The summed currents are converted into voltages by load resistors $R_{L1}$. Output voltages ($V_S$ and $V_S$ bar) of a summer 456 are sampled by a decision-making slicer 458, which is realized here as a standard CML latch.

Cascading the DFE summing amplifier 456 and decision-making slicer 458 as indicated in FIG. 9 is conventional practice but has the drawback of adding significant delay to a critical path 460 of the DFE unless significant power is dissipated. To achieve reliable operation, the feedback signals of the DFE need to be accurately established at the slicer input before the next data decision is made. As indicated by the dashed lines in FIG. 9, the critical path 460 of a DFE is the H1 feedback loop, whose delay must be less than 1 UI. The RC time constant at the output of the summing amplifier 456 can add significant delay to this critical path 460 by degrading the settling time of the feedback signals. To reduce the RC time constant so that the critical timing requirements can be met, the load resistance $R_{L1}$ must often be reduced to a low value. To meet amplifier gain and voltage swing requirements, the reduction in $R_{L1}$ must be accompanied by a commensurate increase in operating currents, leading to higher power dissipation. The input stage of data slicer 458 includes resistive loads $R_{L2}$.

Figure 10:
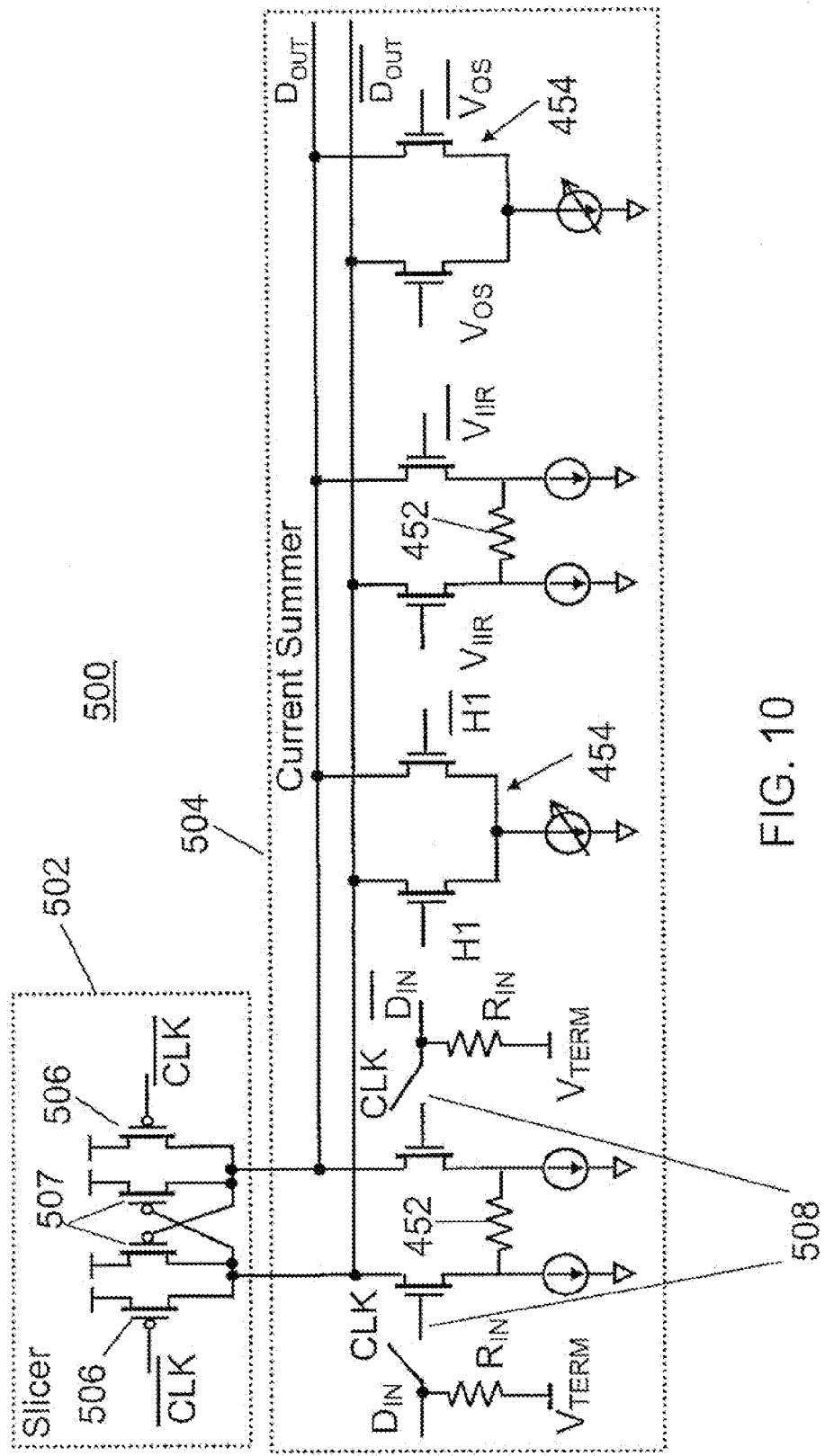
FIG. 10 is a schematic diagram showing a DFE current summer and decision-making slicer combined into a single stage in accordance with one embodiment.

Referring to FIG. 10, a schematic diagram shows a combined slicer and summer circuit 500 in accordance with one embodiment. A more power-efficient way of meeting the critical timing requirements is to eliminate the RC delay by directly injecting summer output currents into a resettable current-comparator PMOS load acting as a slicer 502. When CLK is high (and its complement is low), PMOS reset transistors 506 pull the output nodes up to the positive power supply. When CLK goes low (and its complement goes high), the summer output currents begin to discharge the parasitic capacitors on these nodes to lower voltages. Depending on the sign of the summed differential currents, either a positive or negative differential voltage begins to develop. When the output common-mode falls low enough, the cross-coupled PMOS transistors 507 in the slicer 502 turn on and provide regenerative gain, thereby latching a binary zero or one (depending on the polarity of differential voltage). The elimination of RC delay between the summation and latching functions makes it easier to meet the timing constraints of the DFE critical path and thus permits the desired data rates to be achieved with lower power consumption. Combining these functions into a single circuit stage also saves chip area.

Some of the schematic details shown in FIG. 10 improve DFE performance. For example, passgate sample-and-holds 508 which receive the $D_{IN}$ input signal and are switched by CLK are used to hold the input to a linear transconductor constant during the evaluation phase, which can be relatively lengthy with small input overdrive levels. This holding of the input signal reduces the frequency-dependent loss of the receiver. As in the CML summing amplifier of FIG. 9, resistive degeneration is used to improve the linearity with which $D_{IN}$ and $V_{IIR}$ are converted to currents.

Figure 11:
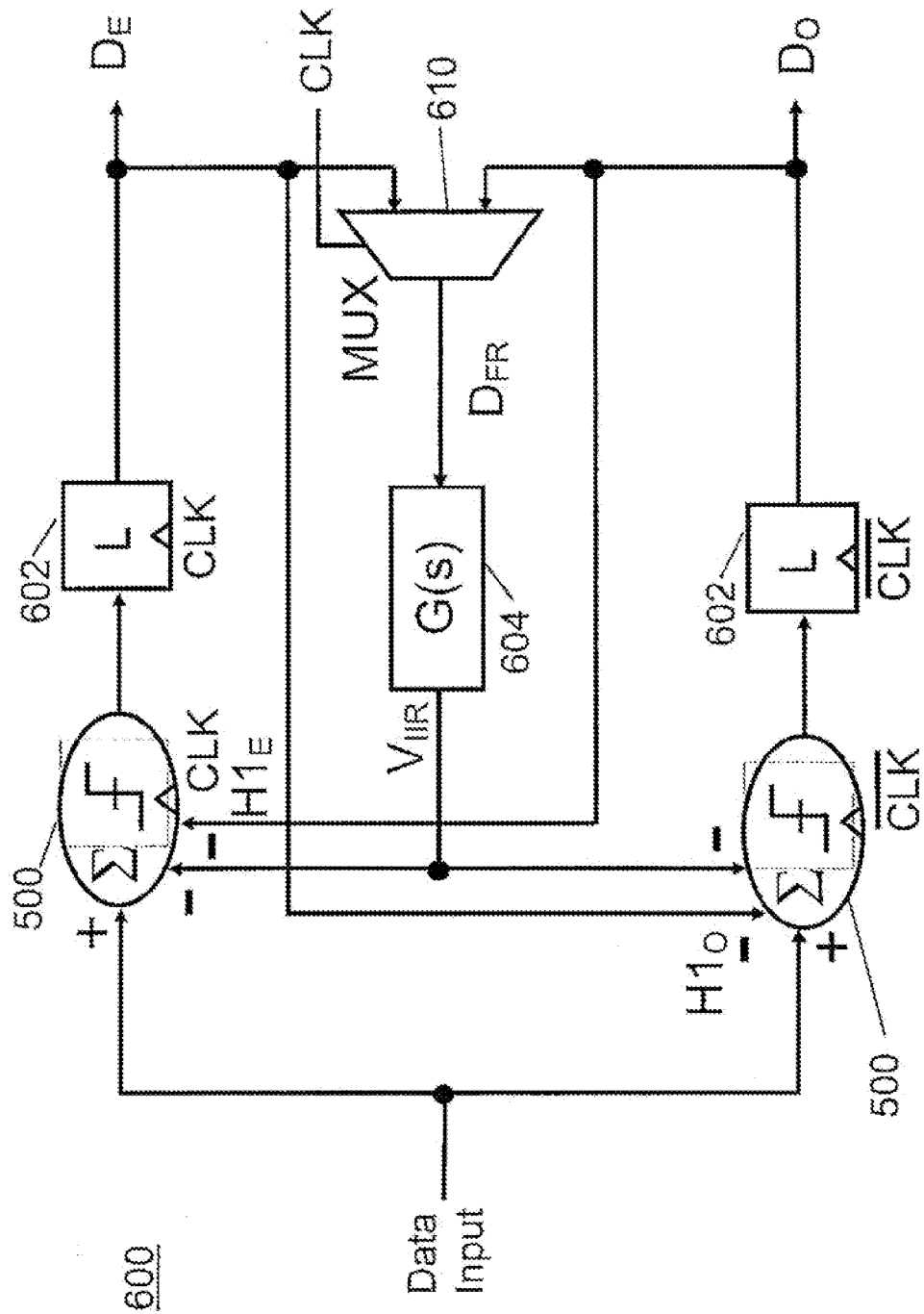
FIG. 11 is a block diagram showing a half-rate architecture of a DFE with IIR filter representing an alternate embodiment which employs the combined summer/slicer circuit of FIG. 10.

Referring to FIG. 11, a half-rate architecture of a DFE 600 with an IIR filter 604 employs the combined summer/slicer circuit 500 in accordance with another embodiment. Since the combined summer/slicer circuit 500 does not maintain a valid data output bit during resetting, slave latches 602 are placed at the outputs of the summer/slicer circuits 500 to keep $D_E$ and $D_O$ valid during both phases of CLK. While each slave latch 602 is in an opaque (or closed) state while its corresponding summer/slicer circuit 500 is resetting, it is switched to a transparent (or open) state when its corresponding summer/slicer circuit 500 is evaluating. Therefore, the slave latches 602 only add a small propagation delay to the $D_E$ and $D_O$ data outputs.

It should be understood that aspects of the embodiment illustrated in FIG. 10 are applicable to multi-tap DFEs as well as DFEs with IIR filters. In other words, combining the summer and slicer has utility independent of using IIR filters in DFE's. For example, if the differential pair receiving the output of the IIR filter 604 ($V_{IIR}$) were replaced by a differential current switch controlled by DFE feedback signal H2 (and similar to that shown for H1), one would obtain a combined summer/slicer circuit (500) suitable for use in a conventional two-tap DFE. If a DFE with more than two taps were desired, the combined summer/slicer 500 could be modified by adding more differential pairs to the current summer 504. Application of the combined summer/slicer circuit 500 could be used to realize conventional multi-tap DFEs with useful reductions in power and area, as the elimination of RC delay between the summation and latching functions makes it easier to meet the critical timing constraints of any DFE.

Many standard latch designs can be used to implement the slave latches 602 shown in FIG. 11, including CML and static CMOS types. However, these standard types of latches may have disadvantages in this application. For example, CML latches are usually considered the fastest available type, but their high static power dissipation is not consistent with the design goal of a power-efficient DFE, which is one motivation behind considering a DFE with an IIR filter. Static CMOS latches are more power-efficient, but their lower speed may increase critical path delays so that the maximum operating frequency of the DFE is degraded.

Figure 12:
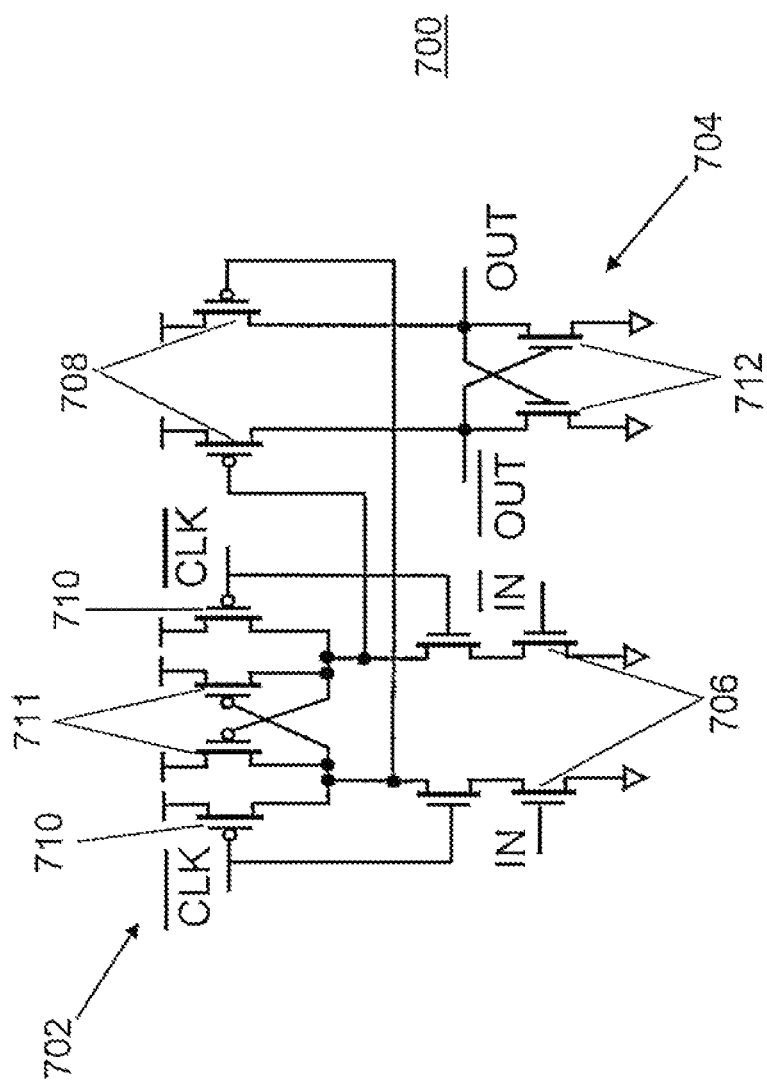
FIG. 12 is a schematic diagram showing a double regenerating latch in accordance with one embodiment.

Referring to FIG. 12, a schematic diagram shows a latching structure 700 with two cascaded differential regenerating stages 702 and 704 which achieves higher speed and sensitivity than a static CMOS latch. In the example embodiment shown in FIG. 12, the first stage input transistors are NMOS devices 706, and the second stage input transistors are PMOS devices 708, but these device types could be reversed without altering the basic operating principles. CLK is held high (and its complement is held low) when the latch 700 is in the opaque state, so PMOS switches 710 precharge the outputs of the first stage 702 to the positive power supply. Since the outputs of the first stage 702 are at the power supply, the PMOS input devices 708 of the second stage 704 are shut off, so this stage just retains its outputs at levels indicative of the previous bit decision. When CLK goes low (and its complement goes high), the first stage 702 is turned on and begins to regenerate the input signal due to the cross-coupling of PMOS transistors 711 in the load. At the same time, the output common-mode of the first stage falls, which then turns on the input transistors 708 of the second stage 704. When the output of the first stage 702 is regenerated to a sufficiently high level, the logical state of stage 704 is switched. Since this stage 704 (which receives no clock signal) has cross-coupled NMOS transistors 712 in its load, its output is amplified with additional regeneration.

Once regeneration is finished, and switching is complete, conduction through the transistors ceases, so this latch dissipates only dynamic power, no static power. For this reason, the latch is much more power-efficient than a CML latch.

In one embodiment, the latch 700 is particularly useful when receiving a weakly regenerating signal from a component such as a summer/slicer (500, FIG. 11). In a particularly useful embodiment, the first stage 702 of the latch 700 is regenerating at the same time as a previous component (e.g., the summer/slicer 500) so that the weakly regenerating input signal is further amplified by the first stage 702. This benefit was confirmed by simulating the latch 700 combined with summer/slicer 500.

In the simulation, the input signal to the summer/slicer 500 is very small so that its output is only weakly regenerating. The weakly regenerating input signal to latch 700 is amplified by the regeneration of the first stage 702, but not fully regenerated to rail-to-rail signal levels by the time CLK goes high (and its complement goes low). Due to extra regeneration, the output of the second stage 704 is amplified further and does approach rail-to-rail signal levels. These rail to rail output signals of the second stage cross each other at a common-mode above half the supply voltage, which makes them suitable for directly driving an NMOS differential current switch (such as the one which realizes the H1 tap in FIGS. 9 and 10), as well as any CML or CMOS logic circuits.

It should be understood that the double regenerating latch illustrated in FIG. 12 is applicable to systems other than DFEs and other than DFEs with IIR filters. As indicated in FIG. 1, conventional multi-tap DFEs include a large number of latches, and the delays of these latches are part of every critical timing path within the DFE. Due to its superior speed and sensitivity compared to other power-efficient latches (such as static CMOS latches), the double regenerating latch 700 can be incorporated into conventional DFE architectures or other circuits to enhance operating frequency without increasing power dissipation. Further, the regenerative latch 700 may be a basic building block of many digital and mixed-signal systems. Since the speed and sensitivity of a latch often have a large influence on the performance of the overall system, many of these systems would benefit from the superior functional characteristics of the double regenerating latch 700.

Figure 13:
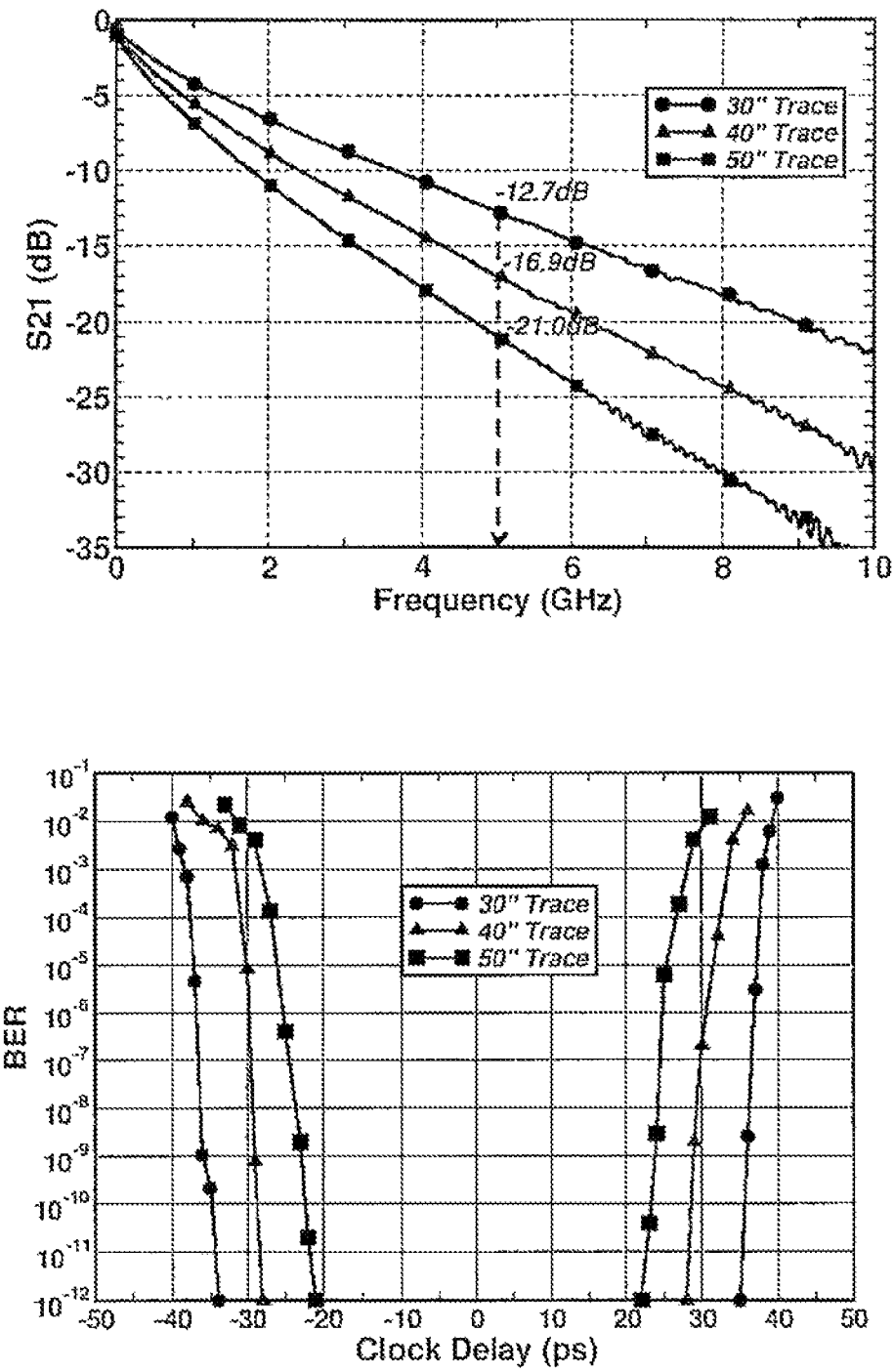
FIG. 13 shows frequency responses of 30", 40", and 50" PCB channels and measured BER bathtub curves equalized by a half-rate DFE with an IIR filter in accordance with the present principles.

To demonstrate the functionality of the half-rate DFE with IIR filter and evaluate its performance, a test chip was designed and fabricated in 65 nm bulk CMOS technology. Since the combined summer/slicer 500 of FIG. 10 was employed, the specific DFE architecture chosen for the design is that shown in FIG. 11. The 2:1 MUX and IIR filter were combined in a single stage 400 as shown in FIG. 8, and the slave latches were implemented as the double regenerating latches 700 of FIG. 12. The equalization capabilities of the DFE with IIR filter were tested by transmitting data over 30", 40", and 50" traces on a high-quality printed circuit board (PCB), which have smooth frequency rolloff characteristics similar to those expected in silicon carrier links. The frequency responses (S21 data) for these channels are shown in FIG. 13. The bathtub curves in the right half of the figure plot the measured BER as a function of clock sampling position when the DFE is equalizing PRBS7 data at 10 gigabits per second. For the 50" trace, the DFE with IIR filter produced a 45% horizontal eye opening at a BER=$10^{-9}$ with error-free operation in the center of the eye, while consuming only 6.8 mW of power. For comparison, a conventional two-tap DFE was implemented using the same base components and power consumption level as the DFE with IIR filter. Table 1 compares the measured horizontal eye openings of the DFE with IIR filter with those of the conventional two-tap DFE at a data rate of 10 gigabits per second for both PRBS7 and PRBS31 data patterns. Over all tested channels, the DFE with IIR filter outperformed the two-tap DFE, highlighting the effectiveness of the present principles.

TABLE 1

| Channels | | Horizontal eye opening (BER < 1 × $10^{-9}$) | |
|---|---|---|---|
| | | DFE with IIR filter | 2-tap DFE |
| 30" trace | PRBS7 | 71% | 47% |
| | PRBS31 | 57% | 24% |
| 40" trace | PRBS7 | 57% | 28% |
| | PRBS31 | 41% | Closed eye |
| 50" trace | PRBS7 | 45% | Closed eye |

Other straightforward modifications and variations of the disclosed embodiments, such as the use of quarter-rate instead of half-rate architecture, will be understood to those skilled in the art. Such modifications and variations do not depart from the spirit and scope of the present principles.

Having described preferred embodiments of circuits and methods for DFE with reduced area and power consumption (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A 1/n-rate decision feedback equalizer (DFE), where n is any positive integer, comprising:
    a plurality of branches, each branch including:
        a separate summer circuit configured to subtract a fractional-rate feedback signal and a full-rate filtered signal from received input, said fractional-rate feedback signal being received from another branch; and
        a latch configured to receive an output of the summer circuit to provide different fractional-rate partial bit sequences based on a clock signal and to provide the fractional-rate partial bit sequences to other branches as fractional-rate feedback signals; and
    a feedback circuit including:
        a multiplexer configured to multiplex the different partial bit sequences of each branch to assemble a full rate bit sequence; and
        a filter configured to provide cancellation of intersymbol interference (ISI) from the received input and to provide a filtered full-rate bit sequence to each of the plurality of branches as the full-rate filtered signal.

2. The DFE as recited in claim 1, wherein the filter includes a continuous-time infinite impulse response (IIR) filter with a frequency-domain transfer function.

3. The DFE as recited in claim 1, further comprising at least one additional latch coupled to the latch, each additional latch having a feedback loop for providing a feedback tap to the summer circuit to add the feedback tap to the received input.

4. The DFE as recited in claim 1, wherein the latch includes a slicer.

5. The DFE as recited in claim 4, wherein the slicer and the summer circuit are combined in a single stage.

6. The DFE as recited in claim 5, wherein each branch includes the single stage with the slicer and the summer circuit and further comprises a slave latch placed at the output of the single stage to keep data valid during phases of a clock cycle.

7. The DFE as recited in claim 6, wherein the slave latch includes a double regenerating latch.

8. The DFE as recited in claim 1, wherein the multiplexer and the filter are combined in a single stage.

9. The DFE as recited in claim 1, wherein the latch of each branch is driven on different phases of the clock signal to provide different partial bit sequences.

10. The DFE as recited in claim 1, wherein the summer in a first branch directly receives an output signal from the latch in a second branch as an input and wherein the summer in the second branch directly receives an output signal from the latch in the first branch.

11. A method for decision feedback equalization, comprising:
    subtracting a feedback signal, received from one or more branches of a 1/n rate decision feedback equalization circuit, and a full-rate filtered signal from a received input using a separate summer circuit for each branch, where n is any positive integer;
    receiving an output of the summer circuit with a latch to provide different fractional-rate partial bit sequences based on a clock signal;
    feeding back an output of each latch to a summer circuit on a different branch as the feedback signal;
    feeding back the output of the latch to a multiplexer, the multiplexer being configured to multiplex the different partial bit sequences of each branch to assemble a full rate bit sequence;
    canceling intersymbol interference (ISI) from the full rate bit sequence; and
    feeding back the ISI-canceled full-rate bit sequence to a summer circuit on each respective branch as the full-rate filtered signal.

12. The method as recited in claim 11, wherein canceling includes canceling ISI using a continuous-time infinite impulse response (IIR) filter with a frequency-domain transfer function.

13. The method as recited in claim 11, further comprising providing a feedback tap to the summer circuit to add the feedback tap to the received input from at least one additional latch.

14. The method as recited in claim 11, wherein the latch and the summer circuit are combined in a single stage and the method further comprising regenerating an output of the single stage using a double regenerating latch.

15. The method as recited in claim 11, wherein the latch of each branch is driven on different phases of the clock signal to provide different partial bit sequences.

16. The method as recited in claim 11, wherein the summer in a first branch directly receives an output signal from the latch in a second branch as an input and wherein the summer in the second branch directly receives an output signal from the latch in the first branch.

* * * * *